(12) United States Patent
Watanabe et al.

(10) Patent No.: US 7,048,796 B2
(45) Date of Patent: May 23, 2006

(54) SILICON SINGLE CRYSTAL WAFER FABRICATING METHOD AND SILICON SINGLE CRYSTAL WAFER

(75) Inventors: Masayuki Watanabe, Hadano (JP); Junichi Osanai, Nishiokitama-gun (JP); Akihiko Kobayashi, Sagamihara (JP); Kazuhiko Kashima, Tokyo (JP); Hiroyuki Fujimori, Hadano (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 0 days.

(21) Appl. No.: 10/941,993

(22) Filed: Sep. 16, 2004

(65) Prior Publication Data

US 2005/0039671 A1 Feb. 24, 2005

Related U.S. Application Data

(62) Division of application No. 10/211,583, filed on Aug. 5, 2002, now abandoned.

(30) Foreign Application Priority Data

Aug. 8, 2001 (JP) .............................. 2001-240312

(51) Int. Cl.
 *C30B 15/20* (2006.01)
(52) U.S. Cl. .............................. 117/19; 117/13; 117/20
(58) Field of Classification Search .................. 117/13, 117/19, 20
See application file for complete search history.

(56) References Cited

U.S. PATENT DOCUMENTS 6,077,343 A * 6/2000 Iida et al. ...................... 117/2
6,180,220 B1 1/2001 Falster et al.
6,261,361 B1 * 7/2001 Iida et al. ...................... 117/19
6,503,594 B1 1/2003 Park
6,517,632 B1 * 2/2003 Minami et al. ............... 117/19

(Continued)

FOREIGN PATENT DOCUMENTS

JP 8-330316 12/1996

(Continued)

OTHER PUBLICATIONS

M. Tamatsuka et al., "High Performance Silicon Wafer With Wide Grown-in Void Free Zone and High Density Internal Gettering Site Achieved Via Rapid Crystal Growth With Nitrogen Doping and High Temperature Hydrogen and/or Argon Annealing," Defects in Silicon 99-1:456-467, The Electrochemical Society, Inc., Pennington, NJ.

(Continued)

Primary Examiner—Felisa Hiteshew
(74) Attorney, Agent, or Firm—Foley & Lardner LLP

(57) ABSTRACT

At the time of fabricating a silicon single crystal wafer from a nitrogen-doped silicon single crystal grown according to the Czochralski method, a silicon single crystal wafer covered with a region in which an oxygen precipitation bulk micro defect and an oxidation induced stacking fault mixedly exist is subjected to heat treatment at a temperature of 1100 to 1300° C. in a reducing gas or inert gas atmosphere. In such a manner, a method of fabricating a high-quality silicon single crystal wafer and a silicon single crystal wafer in which no grown-in crystal defects exist in the whole surface and oxygen precipitation bulk micro defects (BMD) are formed at a sufficiently high density to display the IG effect on the inner side can be provided. The single crystal wafer can be suitably used to form an operation region of a semiconductor device.

20 Claims, 3 Drawing Sheets

U.S. PATENT DOCUMENTS

| | | | |
|---|---|---|---|
| 6,548,035 B1 | 4/2003 | Kimura et al. | |
| 6,599,360 B1 * | 7/2003 | Iida et al. | 117/19 |
| 6,666,915 B1 | 12/2003 | Yang et al. | |
| 2003/0015131 A1 | 1/2003 | Iida | |
| 2003/0172865 A1 | 9/2003 | Iida et al. | |

FOREIGN PATENT DOCUMENTS

| | | |
|---|---|---|
| JP | 2000-272997 A | 10/2000 |
| WO | WO 01/27362 A1 | 4/2001 |
| WO | WO 01/55485 A1 | 8/2001 |
| WO | WO 02/103091 A1 | 12/2002 |

OTHER PUBLICATIONS

M. Iida et al., "Effects of Light Element Impurities on the Formation of Grown-in Defects Free Region of Czochralski Silicon Single Crystal," Defects in Silicon 99-1:499-510, The Electrochemical Society, Inc., Pennington, NJ.

* cited by examiner

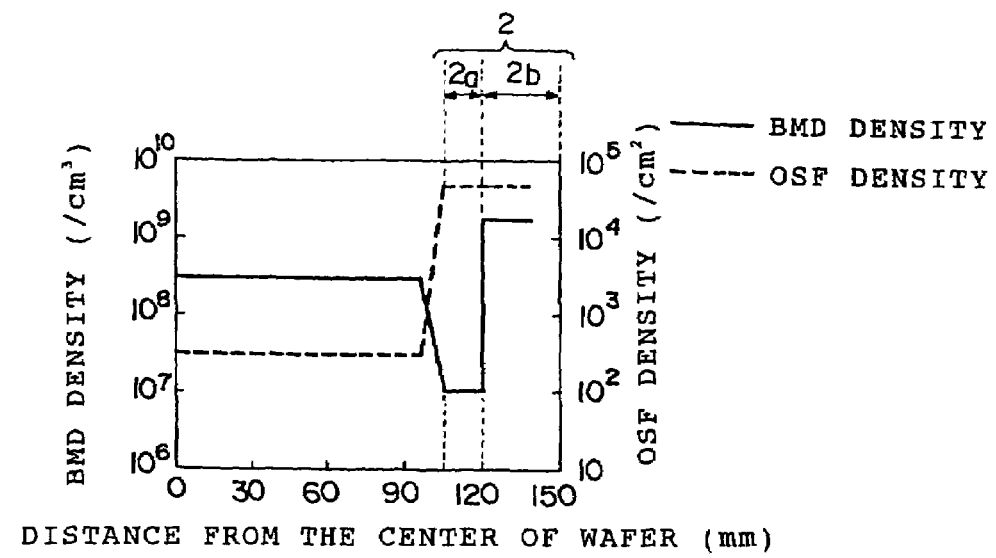
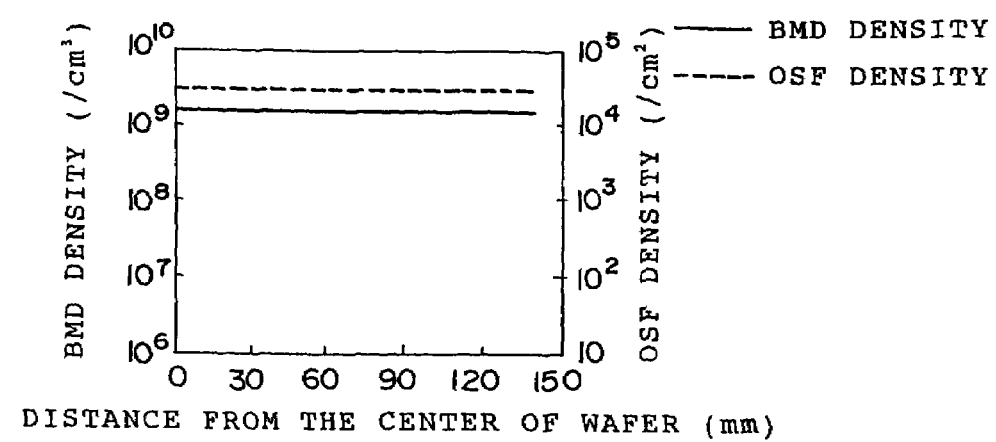
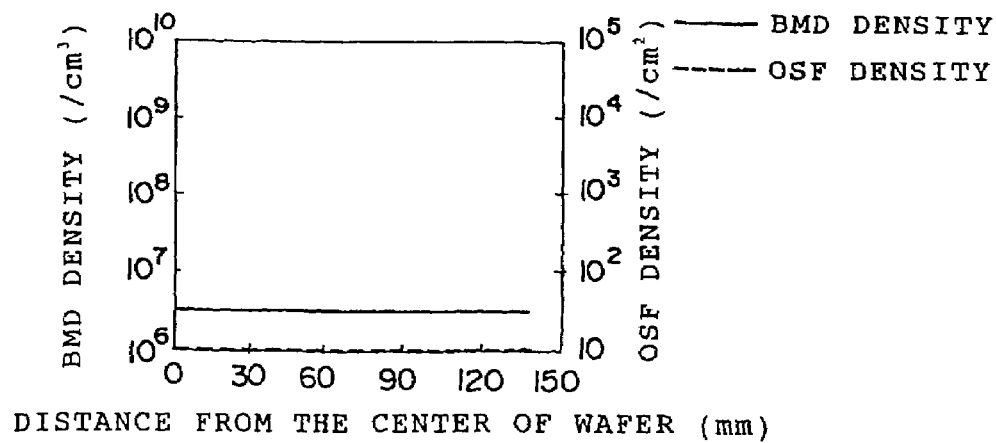

SILICON SINGLE CRYSTAL WAFER FABRICATING METHOD AND SILICON SINGLE CRYSTAL WAFER

The present application is a divisional of U.S. application Ser. No. 10/211,583, filed Aug. 5, 2002, now abandoned the entire contents of which are incorporated herein by reference.

BACKGROUND OF THE INVENTION

1. Field of the Invention

The present invention relates to a method of fabricating a silicon single crystal wafer used for fabricating a semiconductor device or the like and to a silicon single crystal wafer. More particularly, the invention relates to a method of fabricating a silicon single crystal wafer from a nitrogen-doped silicon single crystal grown according to the Czochralski method and to a silicon single crystal wafer fabricated by the method.

2. Description of the Related Art

The most common silicon single crystal wafer used for fabricating a semiconductor device is a one obtained by processing a single crystal ingot grown according to the Czochralski method (CZ method).

According to the CZ method, a single crystal is grown by dipping a seed crystal in a silicon molten in a crystal crucible, pulling the seed crystal away from the molten while rotating the quartz crucible and the seed crystal to grow a cylindrical silicon single crystal, thereby developing an ingot.

In a wafer obtained from the silicon single crystal grown by the CZ method, however, various grown-in crystal defects occur.

One of the grown-in crystal defects is called an oxidation induced stacking fault (OSF) which occurs in a ring shape due to a thermal oxidation process. Since the OSFs occur in a ring shape, this region is called an OSF ring. The width of the OSF ring is usually about a few mm to ten mm. The OSF deteriorates a junction leak characteristic as one of semiconductor device characteristics.

Since oxygen precipitation does not easily occur in the region of the OSF ring, it is difficult to sufficiently form oxygen precipitation bulk micro defects (hereinbelow, called BMD) functioning as a gettering site of a heavy metal which is generated in a semiconductor device fabricating process, that is, IG (Intrinsic Gettering).

Since the OSF ring moves toward the peripheral side of the single crystal as the pulling rate increases, to form the OSF ring in the outermost periphery of a crystal, high-speed pulling of 1.0 mm/min or higher is performed.

However, voids defect called COP (Crystal Originated Particles) exist on the inside of the OSF ring. If nothing is done for the defects, an oxide film resistance characteristic and a junction leak characteristic of a semiconductor device deteriorate.

Consequently, a method of reducing void defects by performing heat treatment in a gaseous hydrogen or argon gas atmosphere is employed.

On the other hand, a method of reducing a void defect region by decreasing the pulling speed to 0.5 mm/min or lower to form the OSF ring in the center of a wafer is also proposed. According to the method, void defects do not occur in the outer side of the OSF ring, and an oxide film resistance characteristic is also excellent.

In this case, however, dislocation clusters often occur in the peripheral portion in a wafer. The dislocation clusters also deteriorate the junction leak characteristic. Further, in this region, oxygen precipitation does not easily occur, so that the IG function deteriorates.

To solve the technical problems, for example, Japanese Unexamined Patent Application No. 8-330316 discloses a technique capable of forming a void-free region in the whole area in the radial direction of a single crystal on the basis of the knowledge that a region in which an infrared scattering defect (void), OSF ring, and dislocation cluster occur can be specified by a ratio expressed by V/G where V denotes a rate (mm/min) of pulling a single crystal and G (° C./mm) denotes an average value of temperature gradient in a crystal in the pulling axis direction in a high temperature range from a silicon melting point to 1300° C.

Specifically, the publication discloses a technique capable of specifying a region including no grow-in crystal defect formed between an OSF ring and a dislocation cluster occurrence region by the V/G value and obtaining a silicon single crystal wafer in which a defect-free region is formed in the whole face by controlling the V/G value in the crystal axis direction and the radial direction at the time of growing a crystal to 0.20 to 0.22 mm$^2$/° C.·min.

However, in a heat-treated wafer obtained from a single crystal grown by a high-speed pulling method, even after the heat treatment, micro void defects each having a size of 0.1 μm or less tend to remain. Consequently, in order to use a wafer for a device of a finder design pattern, such a micro void defect has to be dissipated by performing heat treatment for long time at high temperature.

In the case of pulling a single crystal having a larger diameter of 300 mm or larger, it is difficult to pull the single crystal at high speed. The pulling rate has to be regulated to an intermediate rate of 0.5 to 1.0 mm/min at which an OSF ring remains.

On the other hand, in the case of growing a defect-free region at low speed, it is very difficult to control the V/G value in a narrow range in both of the axial and radial directions of a single crystal. Moreover, oxygen precipitation easily occurs, so that it is necessary to add the IG function or the like by another means. Due to low speed, decrease in productivity is also caused.

To deal with such problems, recently, a method of doping a single crystal with nitrogen at the time of pulling the silicon single crystal in accordance with the CZ method is being variously studied.

For example, it is reported by H. Tamatsuka et al., "DEFECT IN SILICON III, PV99-1" p. 456 that by doping a single crystal with nitrogen, the size of avoid defect is reduced. As a result, by a high-temperature heat treatment in a gaseous hydrogen or argon gas atmosphere, the void defect is easily dissipated. A surface layer portion without a void defect from the surface of the wafer to the depth of 10 μm or more is formed.

However, in order to sufficiently and reliably form such a surface layer portion, oxygen concentration in the crystal has to be suppressed. In this case, it becomes difficult to form BMDs functioning as a getter site at a density of $1\times10^9$/cm$^3$ or higher.

Consequently, only by a single crystal pulled at a high speed of 1.8 mm/min under an oxygen concentration condition of a very narrow range, both the front layer portion and the BMD can be formed. It cannot be said that the method is sufficient as an industrial wafer fabricating method, and there is a room to improve.

It is reported by M. Iida et al., "DEFECT IN SILICON III, PV99-1" p. 499 that, by doping a single crystal with nitrogen, a defect-free region is expanded, that is, the range of the V/G value of the defect-free region is widened. Simultaneously, a region in which the OSF ring occurs also expands. However, the OSF ring can be made disappear by lowering the oxygen concentration and, by the amount, the V/G value shifts to a larger value and the defect-free region expands.

As described above, by doping a single crystal with nitrogen, it becomes easier to form a defect-free region. However, it is still difficult to form a sufficient amount of BMDs in the defect-free region. Particularly, it is difficult to form BMDs in a wafer of low oxygen concentration.

SUMMARY OF THE INVENTION

The present invention has been achieved to solve the technical problems, and its object is to provide a silicon single crystal wafer fabricating method capable of obtaining a high-quality wafer having no grown-in crystal defects in an entire surface, in which BMDs are formed at a sufficiently high density on the inner side to display an IG effect.

Another object is to provide a silicon single crystal wafer suitable for forming an operation region of a semiconductor device, having excellent reliability and a junction leak characteristic of a gate oxide film by the fabricating method.

According to the invention, there is provided a silicon single crystal wafer fabricating method of fabricating a silicon single crystal wafer from a nitrogen-doped silicon single crystal grown according to the Czochralski method, characterized in that a silicon single crystal wafer covered with a region (M-band) in which an oxygen precipitation bulk micro defect (BMD) and an oxidation induced stacking fault (OSF) mixedly exist is subjected to heat treatment at a temperature of 1100 to 1300° C. in a reducing gas or inert gas atmosphere.

According to the invention, by annealing the wafer covered with the M-band obtained from the nitrogen-doped silicon single crystal at high temperature in a reducing or inert gas atmosphere, a wafer in which the OSF and BMD in the surface layer portion are reduced and BMDs are formed on the inner side at a sufficiently high density to display the IG effect is obtained.

Preferably, at the time of growing the nitrogen-doped silicon single crystal, a V/G value as a ratio between a pulling rate V (mm/min) of a single crystal and a temperature gradient G (° C./mm) in the axial direction of the single crystal where a region (M-band) in which both the oxygen precipitation bulk micro defect (BMD) and an oxidation induced stacking fault (OSF) mixedly exist is formed, near a crystallization interface is preliminarily determined at each doping nitrogen concentration, and a pulling condition is adjusted so as to satisfy the V/G value, thereby forming a region (M-band) in which an oxygen precipitation bulk micro defect (BMD) and an oxidation induced stacking fault (OSF) mixedly exist in the single crystal.

Since the M-band is specified by the V/G value, by the fabricating method, a silicon single crystal ingot in which the M-band is formed in a wide range in the core portion can be obtained reliably and easily. Thus, a wafer in which no grown-in defects exists in the surface layer portion but the BMDs are formed on the inner side at a sufficiently high density to produce the IG effect can be mass produced at a high yield.

According to the invention, there is also provided a silicon single crystal wafer fabricated by the silicon single crystal wafer fabricating method, characterized in that no grown-in crystal defects exist in a surface layer portion having a depth of at least 10 μm from the surface, and oxygen precipitation bulk micro defects (BMD) are formed at a density of $1 \times 10^9/cm^3$ or higher on the inner side.

Such a silicon single crystal wafer has excellent reliability of a gate oxide film and excellent junction leak characteristic and can be suitably used for forming an operation region of a semiconductor device.

BRIEF DESCRIPTION OF THE DRAWINGS

The invention will be described in more detail with reference to the attached drawings.

FIGS. 2A to 2C are diagrams showing in-plane distributions of BMD and OSF of wafers taken along lines A—A (FIG. 2A), B—B (FIG. 2B), and E—E (FIG. 2C), respectively, of the nitrogen-doped silicon single crystal of FIG. 1B.

DESCRIPTION OF THE PREFERRED EMBODIMENT

The invention will be described more specifically hereinbelow with reference to the drawings.

Figure 1A:
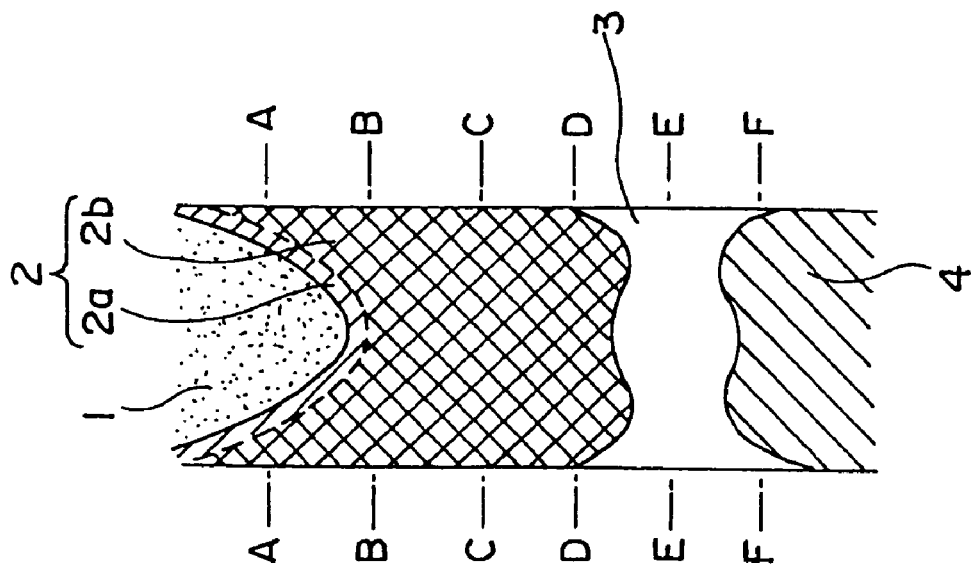
FIGS. 1A and 1B are longitudinal cross sections schematically each showing the relation between V/G and a defect distribution in a silicon single crystal in the case where the silicon single crystal is not doped with nitrogen (FIG. 1A) and in the case where the silicon single crystal is doped with nitrogen (FIG. 1B)
Figure 1B:
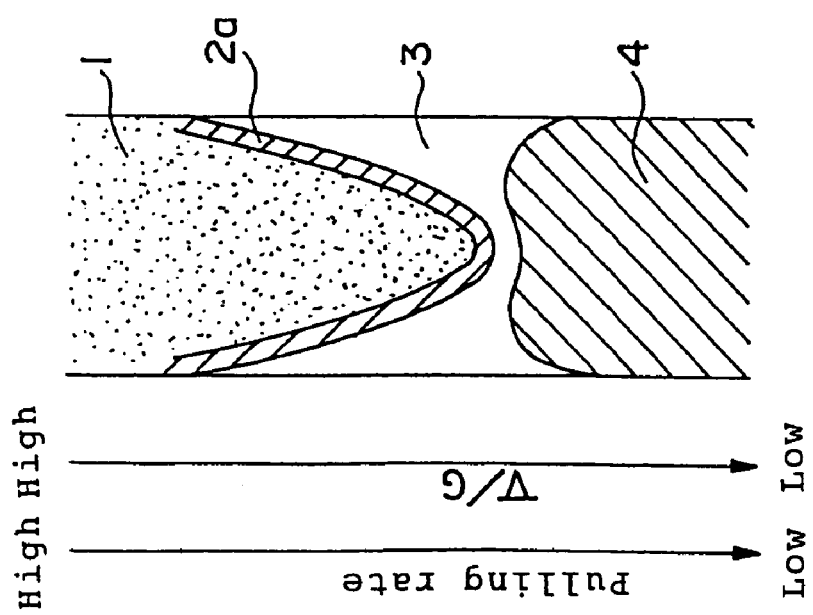

FIGS. 1A and 1B are longitudinal cross sections each schematically showing the relation between a ratio V/G between a pulling ratio V of a silicon single crystal a temperature gradient G in the axial direction of the single crystal near a crystallization interface and a defect distribution in a longitudinal section direction of the single crystal. FIG. 1A shows the case where the silicon single crystal is not doped with nitrogen and FIG. 1B shows the case where the silicon single crystal is doped with nitrogen.

The nitrogen concentration in the silicon single crystal is $2 \times 10^{14}$ atoms/cm$^3$, and the oxygen concentration is $1.2 \times 10^{16}$ atoms/cm$^3$. The oxygen concentration in the invention is expressed by a value obtained by a conversion factor according to the old ASTM.

FIGS. 2A to 2C are diagrams showing in-plane distributions of BMD and OSF of wafers taken along lines A—A (FIG. 2A), B—B (FIG. 2B), and E—E (FIG. 2C), respectively, of the nitrogen-doped silicon single crystal of FIG. 1B.

As shown in FIGS. 1A and 1B, in the case of growing a single crystal while decreasing the pulling rate V, that is, changing the V/G value so as to decrease, in both of the case where the single crystal is not doped with nitrogen (FIG. 1A) and the case where the single crystal is doped with nitrogen (FIG. 1B), occurrence of grown-in crystal defects changes like a void defect occurrence region 1, an OSF ring occurrence region 2 and, while sandwiching a defect-free region 3, a dislocation cluster occurrence region 4.

As understood by comparing FIGS. 1A and 1B with each other, by the nitrogen doping, the OSF ring occurrence region 2 and the defect-free region 3 are expanded.

As described above, in the OSF ring occurrence region, although no void defect occurs, it is difficult to form a BMD. Consequently, it is considered that a wafer obtained in the region is not adapted as a wafer for a semiconductor device.

However, as understood from FIG. 2A showing the in-plane distribution of the OSF and BMD of the wafer taken along line A—A of FIG. 1B, in the OSF ring occurrence region 2, in reality, a region 2b in which many BMDs are formed (hereinbelow, called an M-band) is formed on the outside of a region 2a in which a small amount of BMDs is formed (hereinbelow, called a P-band). The OSF ring occurrence region 2 is divided into the two regions.

Particularly, in the nitrogen-doped single crystal as shown in FIG. 1B, the P-band 2a is narrow whereas the M-band 2b expands to the outside of the P-band 2a where the V/G value is small.

Since the wafer taken along line B—B of FIG. 1B corresponds to the M-band 2b, as shown in FIG. 2B, BMDs occur at a density of $1×10^9/cm^3$ or higher uniformly in the entire plane of the wafer. The wafers taken along line C—C and line D—D of FIG. 1B are similar to the wafer.

The wafer taken along line E—E of FIG. 1B corresponds to the defect-free region 3. Consequently, as shown in FIG. 2C, although no OSF occurs, the BMDs are formed at a density less than $1×10^7/cm^3$. The density is not high enough.

According to the invention, a nitrogen-doped silicon single crystal is grown under the condition that the M-band in which the OSF and BMD mixedly exist is formed in a wide range, a wafer covered with the M-band obtained from the single crystal is subjected to high-temperature annealing in a reducing gas or inert gas atmosphere, thereby obtaining a wafer in which the OSF and BMD are reduced in the region from the surface to the depth of 10 μm or deeper and BMDs are formed at a sufficiently high density of $1×10^9/cm^3$ or higher on the inside to display the IG effect.

As described above, the M-band is a region where void defects do not originally occur. Therefore, by performing the high-temperature annealing, a silicon single crystal wafer in which no grown-in crystal defect exists from the surface to the depth of 10 μm or deeper, suitable for forming an operation region of a semiconductor device can be obtained.

Although the concentration of doped nitrogen of the nitrogen-doped silicon single crystal according to the invention is not particularly limited, from a viewpoint of forming a wide M-band or the like, it is preferably in a range from about $0.5×10^{14}$ to $5×10^{14}$ atoms/cm$^3$.

Preferably, the oxygen concentration is usually, from a viewpoint of forming BMDs at a sufficiently high density, in a range from about $0.8×10^{16}$ to $1.4×10^{18}$ atoms/cm$^3$.

The M-band is specified by the V/G value, that is, the ratio between the pulling rate V (mm/min) of the single crystal and a temperature gradient G (° C./mm) in the axial direction of the single crystal near the crystallization interface.

Figure 3:
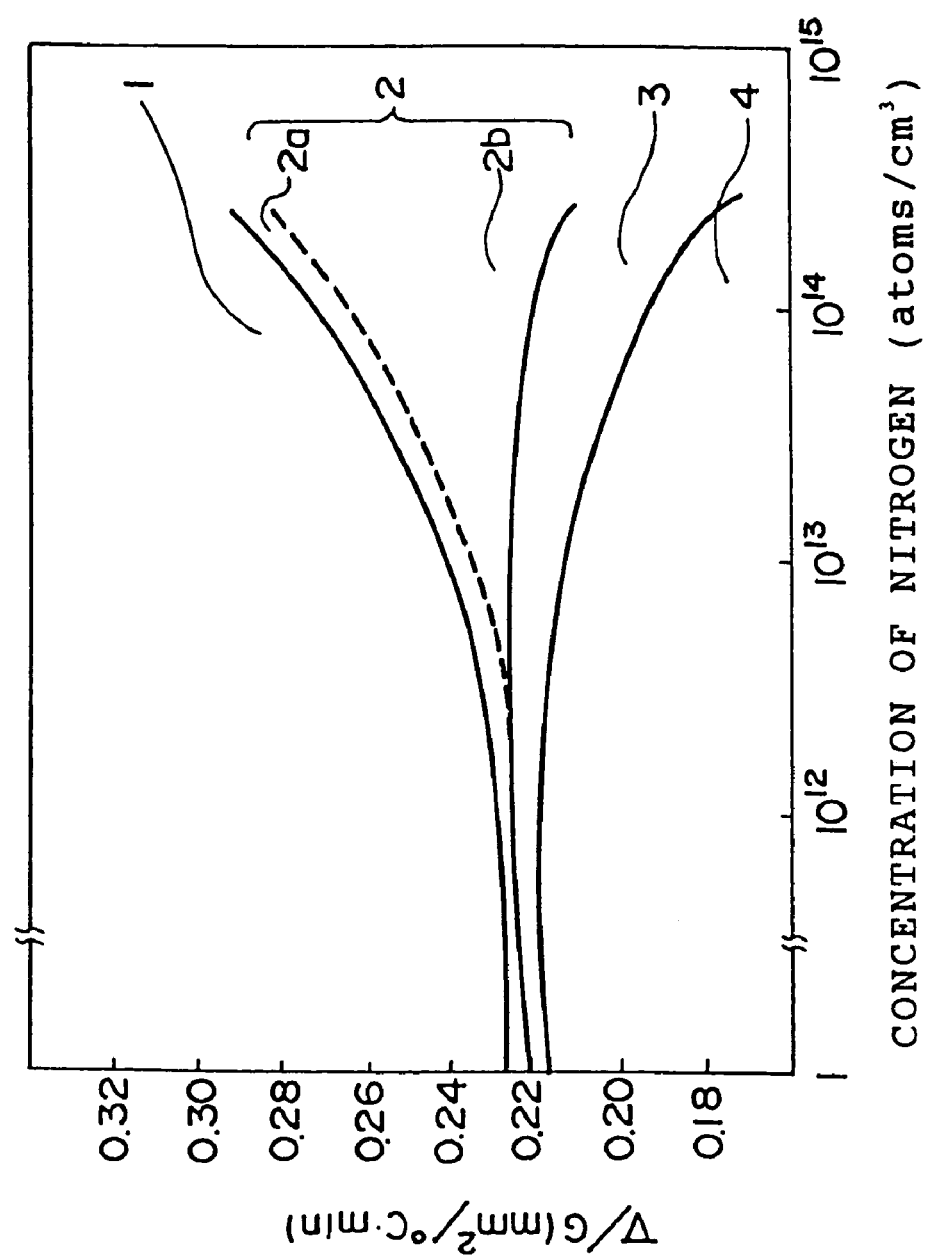
FIG. 3 is a diagram showing the correlation between nitrogen concentration of a nitrogen-doped silicon single crystal and V/G values of various grown-in crystal defect generating region.

FIG. 3 is a diagram showing the correlation between the nitrogen concentration in the nitrogen-doped silicon single crystal and the V/G values in various grown-in crystal defect occurrence regions. It shows the case where the concentration of oxygen is $1.2×10^{18}$ atoms/cm$^3$.

Since each of the V/G values corresponding to the various grown-in crystal defects occurrence regions changes according to the nitrogen concentration and oxygen concentration in the single crystal to be grown, it is preferable to preliminarily obtain the correlation between the M-band associated with the change in the concentration of nitrogen and the V/G value as shown in FIG. 3 and adjust V and/or G on the basis of the correlation to grow a single crystal.

In a practical oxygen concentration range from $0.8×10^{18}$ to $1.4×10^{18}$ atoms/cm$^3$, a change in the V/G value in the M-band in accordance with oxygen concentration is very small.

By using evaluation of a BMD precipitation distribution as shown in FIG. 2 at the time of specifying the M-band, the M-band can be specified reliably and easily.

In the invention, in such a manner, the single crystal is grown by determining the range of the V/G value to form the M-band and adjusting the single crystal pulling rate V and the temperature gradient G in the axial direction of the single crystal near the crystallization interface so as to satisfy the V/G value.

Consequently, a silicon single crystal ingot in which the M-band is formed in a wide range in the core portion can be obtained reliably and easily. Thus, a wafer in which no OSF and BMD exists in the surface layer portion and BMDs are formed at a sufficiently high density to display the IG effect on the inner side can be mass produced at a high yield.

Specifically, for example, a predetermined amount of polysilicon of high impurity is charged into a quartz crucible and melted and, by using the nitrogen concentration and oxygen concentration as parameters, a single crystal having a predetermined diameter is grown so that the V/G value decreases from the head toward the tail.

In this case, the G value can be obtained from analysis of heat transmission by a computer, and the M-band is determined on the basis of the BMD precipitation evaluation as described above.

A wafer covered with the M-band is fabricated from the silicon single crystal ingot and subjected to annealing at high temperature in a reducing or inert gas atmosphere.

In the annealing, it is preferable to use hydrogen, ammonia, or the like as a reducing gas and to use argon, helium, neon, or the like as an inert gas. More preferably, a hydrogen gas or argon gas is used. In such a gas atmosphere, the wafer is treated for about 0.5 to 3 hours at a high temperature in a range from 1100 to 1300° C., preferably, at about 1200° C.

According to the fabricating method, the silicon single crystal wafer in which no grown-in crystal defect exists in the surface portion from the surface to the depth of at least 10 μm, and BMDs are formed at a sufficiently high density of $1×10^9/cm^3$ or higher to display the IG effect on the inner side can be obtained. Such a silicon single crystal wafer can be suitably used to form an operation region of a semiconductor device.

EXAMPLES

The invention will be described hereinbelow more concretely on the basis of examples. The invention is not limited to the examples.

250 kg of high-purity polysilicon was charged into a 32-inch quartz crucible. <100> Crystal of 12 inches was grown by using a nitrogen concentration and an oxygen concentration as parameters so that the V/G value decreases from the head toward the tail, thereby obtaining a nitrogen-doped silicon single crystal.

With respect to a wafer and a longitudinal section sample obtained from the single crystal, the correlation of the grown-in crystal defects and the V/G value was evaluated. The G value was obtained from the heat transmission analysis by a computer. The M-band was specified by the BMD precipitation evaluation.

From the relation between the grown-in crystal defect and the V/G value, the V/G value of the M-band under predetermined growth conditions (the nitrogen and oxygen concentrations) was determined.

As a result, in the case where the nitrogen concentration is $2×10^{14}$ atoms/cm$^3$ and the oxygen concentration is $1.2×10^{18}$ atoms/cm$^3$, it was found that the V/G value of the M-band lies in the range from 0.275 to 0.215 mm²/° C.·min. It is understood from the result of heat transmission analysis that the G value changes from 3° C./mm at the head toward 2° C./mm at the tail.

Therefore, the silicon single crystal was grown while adjusting, according to the pulling conditions, the pulling rate to 0.825 to 0.645 mm/min on the head side and to 0.550 to 0.430 mm/min on the tail side.

As a result, a silicon single crystal ingot in which the M-band is formed in a wide range from the head to the tail was grown, and a silicon single crystal wafer covered with the M-band was obtained from the single crystal ingot.

Further, the obtained wafer was subjected to annealing at 1200° C. for one hour in a gaseous hydrogen atmosphere. As a result, a high-quality wafer having no grown-in crystal defects in the surface layer portion having a depth of at least 10 µm from the surface but having, on the inner side, BMDs which are uniformly formed at $1 \times 10^9/\text{cm}^3$ or higher was obtained.

A wafer was obtained from a portion adjacent to the portion from which the wafer subjected to the hydrogen annealing was taken in the single crystal ingot. The wafer was annealed at 1200° C. for two hours in an argon gas atmosphere.

In this case as well, a high-quality wafer similar to the wafer subjected to the hydrogen annealing was obtained.

As described above, by the fabricating method according to the invention, a high-quality silicon single crystal wafer in which harmful grown-in crystal defects such as OSF, void defect, and dislocation cluster do not exist in the whole surface layer portion and, on the inner side, BMDs are formed at a sufficiently high density to display the IG effect can be obtained reliably and easily.

The silicon single crystal wafer according to the invention has excellent reliability of a gate oxide film and an excellent junction leak characteristic and can be suitably used for forming an operation region of a semiconductor device. By using the wafer for a finer circuit device having a higher packing density, the device characteristics and manufacturing yield of the device can be improved.

What is claimed is:

1. A silicon single crystal wafer fabricating method of fabricating a silicon single crystal wafer from a nitrogen-doped silicon single crystal grown according to the Czochralski method,
   wherein a silicon single crystal wafer covered with a region in which an oxygen precipitation bulk micro defect and an oxidation induced stacking fault mixedly exist is subjected to heat treatment at a temperature of 1100 to 1300° C. in a reducing gas or inert gas atmosphere.

2. The silicon single crystal wafer fabricating method according to claim 1, wherein at the time of growing said nitrogen-doped silicon single crystal, a V/G value as a ratio between a pulling rate V (mm/min) of a single crystal and a temperature gradient G (° C./mm) in the axial direction of the single crystal where a region in which both the oxygen precipitation bulk micro defect and an oxidation induced stacking fault mixedly exist is formed, near a crystallization interface is preliminarily determined at each doping nitrogen concentration, and a pulling condition is adjusted so as to satisfy the V/G value, thereby forming a region in which an oxygen precipitation bulk micro defect and an oxidation induced stacking fault mixedly exist in the single crystal.

3. The silicon single crystal wafer fabricating method according to claim 2, wherein a region in which both the oxygen precipitation bulk micro defect and the oxidation induced stacking fault mixedly exist is formed in a wide range in a core portion of the nitrogen-doped silicon single crystal.

4. The silicon single crystal wafer fabricating method according to claim 2, wherein the concentration of doped nitrogen of said nitrogen-doped silicon single crystal is in a range from $0.5 \times 10^{14}$ to $5 \times 10^{14}$ atoms/cm³.

5. The silicon crystal wafer fabricating method according to claim 2, wherein the oxygen concentration at the time of growing said nitrogen-doped silicon single crystal is in a range from $0.8 \times 10^{16}$ to $1.4 \times 10^{18}$ atoms/cm³.

6. The silicon single crystal wafer fabricating method according to claim 2, wherein an adjustment for said pulling condition is carried out to preliminarily obtain the correlation between the region in which both the oxygen precipitation bulk micro defect and the oxidation induced stacking fault mixedly exist according to the change in the concentration of nitrogen and the V/G value and adjust V and/or G on the basis of the correlation.

7. The silicon single crystal wafer fabricating method according to claim 2, wherein said pulling condition is adjusted so that the V/G value decreases from the head of nitrogen-doped silicon single crystal toward to the tail.

8. The silicon single crystal wafer fabricating method according to claim 2, wherein the pulling condition is adjusted so as to satisfy said V/G value in the range from 0.275 to 0.215 mm²/° C. min.

9. The silicon single crystal wafer fabricating method according to claim 8, wherein in said pulling condition, the pulling rate is adjusted from 0.825 to 0.645 mm/min on the head side of a nitrogen-doped silicon single crystal and from 0.550 to 0.430 mm/min on the tail side.

10. The silicon single crystal wafer fabricating method according to claim 1,
    wherein no grown-in crystal defects exist in a surface layer portion having a depth of at least 10 µm from the surface, and oxygen precipitation bulk micro defects are formed at a density of $1 \times 10^9/\text{cm}^3$ or higher on an inner side of the surface layer portion.

11. The silicon single crystal wafer fabricating method according to claim 1, wherein said reducing gas is hydrogen or ammonia.

12. The silicon single crystal wafer fabricating method according to claim 1, wherein said inert gas is argon, helium or neon.

13. The silicon single crystal wafer fabricating method according to claim 1, wherein said heat treatment is subjected to a hydrogen gas or argon gas atmosphere.

14. The silicon single crystal wafer fabricating method according to claim 1, wherein said heat treatment is carried out for 0.5 to 3 hours under a temperature range from 1150 to 1250° C.

15. A silicon single crystal wafer fabricating method of fabricating a silicon single crystal wafer from a nitrogen-doped silicon single crystal grown according to the Czochralski method,
    wherein a silicon single crystal wafer covered with a region in which an oxygen precipitation bulk micro defect and an oxidation induced stacking fault mixedly exist is subjected to heat treatment at a temperature of 1100 to 1300° C. in a reducing gas or inert gas atmosphere and, at the time of growing said nitrogen-doped silicon single crystal, a V/G value as a ratio between a pulling rate V (mm/min) of a single crystal and a temperature gradient G (° C./mm) in the axial direction of the single crystal where a region in which both the oxygen precipitation bulk micro defect and an oxidation induced stacking fault mixedly exist is formed, near a crystallization interface is preliminarily determined at each doping nitrogen concentration in the range from $0.5 \times 10^{14}$ to $5 \times 10^{14}$ atoms/cm$^3$, then a pulling condition is adjusted so as to satisfy the V/G value, thereby forming a region in which the oxygen precipitation bulk micro defect and the oxidation induced stacking fault mixedly exist in the single crystal.

16. The silicon single crystal wafer fabricating method according to claim 15,
    wherein no grown-in crystal defects exist in a surface layer portion having a depth of a at least 10 µm from the surface, and oxygen precipitation bulk micro defects are formed at a density of $1 \times 10^9$/cm$^3$ or higher an the inner side of the surface layer portion.

17. The silicon single crystal wafer fabricating method according to claim 15, wherein said reducing gas is hydrogen or ammonia.

18. The silicon single crystal wafer fabricating method according to claim 15, wherein said inert gas is argon, helium or neon.

19. The silicon single crystal wafer fabricating method according to claim 15, wherein said heat treatment is carried out for 0.5 to 3 hours at a temperature in the range from 1150 to 1250° C.

20. The silicon single crystal wafer fabricating method according to claim 15, wherein a region in which both said oxygen precipitation bulk micro defect and the oxidation induced stacking fault mixedly exist is formed in a wide range in the core portion of the nitrogen-doped silicon single crystal.

* * * * *